(12) United States Patent
Kontani et al.

(10) Patent No.: US 9,756,729 B2
(45) Date of Patent: Sep. 5, 2017

(54) SEMICONDUCTOR DEVICE HAVING A FIRST CIRCUIT BOARD MOUNTED WITH A PLURALITY OF SEMICONDUCTOR ELEMENTS AND A SECOND CIRCUIT BOARD MOUNTED WITH A PLURALITY OF ELECTRONIC COMPONENTS

(71) Applicant: KABUSHIKI KAISHA TOYOTA JIDOSHOKKI, Kariya-shi, Aichi (JP)

(72) Inventors: Kazuyoshi Kontani, Kariya (JP); Atsushi Dojiri, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 0 days.

(21) Appl. No.: 14/597,752

(22) Filed: Jan. 15, 2015

(65) Prior Publication Data
US 2015/0208524 A1 Jul. 23, 2015

(30) Foreign Application Priority Data
Jan. 17, 2014 (JP) ................................. 2014-006582

(51) Int. Cl.
H05K 5/00 (2006.01)
H05K 1/18 (2006.01)
(Continued)

(52) U.S. Cl.
CPC ........... *H05K 1/181* (2013.01); *H01R 12/515* (2013.01); *H05K 7/1432* (2013.01);
(Continued)

(58) Field of Classification Search
CPC ........... H01L 2924/1011; H01L 25/162; H01L 23/053; H01L 23/4006; H02M 7/003;
(Continued)

(56) References Cited

U.S. PATENT DOCUMENTS 5,603,639 A * 2/1997 Lai et al. ................. 439/607.31
2003/0168726 A1 9/2003 Ishii et al.
(Continued)

FOREIGN PATENT DOCUMENTS

EP 1677389 7/2006
EP 1677389 B1 7/2006
(Continued)

OTHER PUBLICATIONS

European Patent Application No. 15150596.3: Extended European Search Report dated Feb. 12, 2016, 8 pages.

*Primary Examiner* — James Wu
(74) *Attorney, Agent, or Firm* — Baker & Hostetler LLP

(57) ABSTRACT

A connecting terminal includes an external terminal connecting portion, having an end surface to connect an external terminal thereto and located at a second principal surface side of a second circuit board faces, and a substrate-fixed portion which is securely connected to a first circuit board. A seal attachment portion is provided on a portion of the external terminal connecting portion including the end surface to attach thereto a seal member to seal a gap between the portion and the case. The connecting terminal includes a reduced sectional area portion having a sectional area smaller than an area of the top end surface in a region close to a plurality of electronic components arranged on the second circuit board on the external terminal connecting portion. The reduced sectional area portion is provided from the seal attachment portion to an end in the opposite side of the end surface.

5 Claims, 9 Drawing Sheets

(51) Int. Cl.
  *H01R 12/51* (2011.01)
  *H05K 7/14* (2006.01)
  *H05K 1/14* (2006.01)
  *H02M 7/00* (2006.01)
  *H01R 13/52* (2006.01)
  *H01R 13/631* (2006.01)
  *H05K 3/32* (2006.01)

(52) U.S. Cl.
  CPC ....... *H01R 13/5202* (2013.01); *H01R 13/6315* (2013.01); *H02M 7/003* (2013.01); *H05K 1/144* (2013.01); *H05K 3/325* (2013.01); *H05K 2201/09063* (2013.01)

(58) Field of Classification Search
  CPC ........... H05K 1/144; H05K 2201/2036; H05K 1/181; H05K 2201/10409; H05K 2201/10598; H05K 7/026; H05K 1/0271; H05K 1/14; H05K 2201/041; H05K 2201/042; H05K 2201/09754; H05K 7/20845; H05K 7/2089; H01R 11/26
  USPC ....... 361/752, 760, 783, 784, 796, 801, 803; 174/50, 50.52; 439/74, 76.1, 76.2, 78
  See application file for complete search history.

(56) References Cited

U.S. PATENT DOCUMENTS

2006/0141821 A1* 6/2006 Berglund et al. ............ 439/76.1
2014/0210067 A1   7/2014 Takamiya et al.

FOREIGN PATENT DOCUMENTS

| JP | H9-102580 A | 4/1997 |
| JP | 2008-198921 A | 8/2008 |
| JP | 3173512 U | 11/2012 |
| JP | 2013-102112 | 5/2013 |
| WO | WO 02/082542 A1 | 10/2002 |
| WO | WO 2013-047101 A1 | 4/2013 |

* cited by examiner (a)                    (b)

Fig.8
(a)
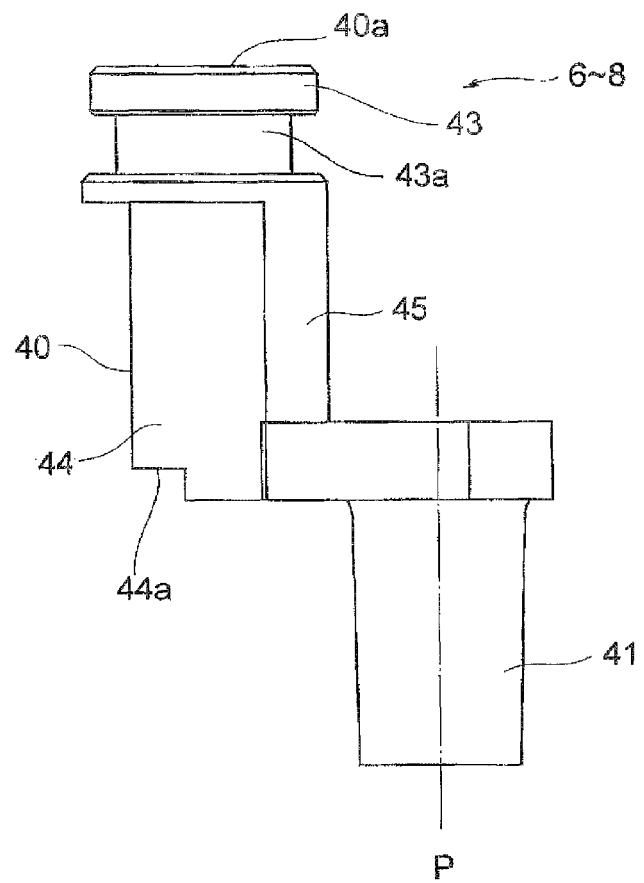
(b)
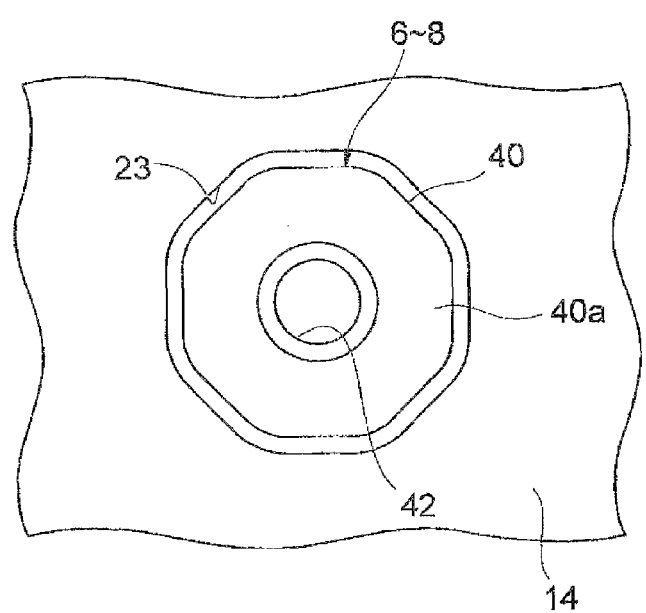

(a)  (b)

SEMICONDUCTOR DEVICE HAVING A FIRST CIRCUIT BOARD MOUNTED WITH A PLURALITY OF SEMICONDUCTOR ELEMENTS AND A SECOND CIRCUIT BOARD MOUNTED WITH A PLURALITY OF ELECTRONIC COMPONENTS

CROSS-REFERENCE TO RELATED APPLICATIONS

This application claims priority to Japanese Application No. P2014-006582 filed Jan. 17, 2014, the disclosure of which is incorporated herein by reference in its entirety.

BACKGROUND OF THE INVENTION

Field of the Invention

The present invention relates to a semiconductor device.

Related Background Art

There are known semiconductor devices such as a semiconductor device discussed in JP Registered Utility Model Publication No. 3173512. The semiconductor device discussed in JP Registered Utility Model Publication No. 3173512 includes a main circuit board mounted with a plurality of semiconductor elements composing a main circuit, a capacitor substrate which is closely arranged on the main circuit board and mounted with a plurality of capacitors, and a control circuit board which is arranged on the capacitor substrate with a distance provided in between and mounted with a control circuit controlling the main circuit. A positive input terminal, a negative input terminal, and three output terminals are mounted on the main circuit board. Each terminal includes a bus bar extending from the main circuit board and a cylinder portion which is provided upright on the bus bar and penetrates the capacitor substrate and the control circuit board.

SUMMARY OF THE INVENTION

In the contrast with the related art, the conventional semiconductor device has a large mount region for terminal electrodes on the main circuit board because the bus bar of the terminal electrode of each of the input terminal, the output terminal, and the like includes a plurality of terminal securing portions for securing a terminal on the main circuit board and a region where the cylinder portion is provided. The cylinder portion electrically connects the main circuit and an external wiring. To meet demand for development of an even smaller semiconductor device, the mount region of the terminal electrode on the main circuit board needs to be reduced.

A top end surface of the cylinder portion of the terminal electrode is exposed from a case and an end portion including the top end surface of the cylinder portion constitutes an external terminal connecting portion. To provide a waterproof property to the inside of the case, an O-ring is needed to be attached in a gap between the case and the cylinder portion. If the cylinder portion is formed to have a tapered shape, in which a diameter gradually decreases from the main circuit board toward the top end surface, so as to provide easy attachment of the O-ring, an area of the top end surface, that is, an area of the region to which an external wiring terminal is connected is reduced. An electric current concentrates on the top end surface. When the top end surface area is small, therefore, the cylinder portion (end portion) is likely to generate heat which is thermally disadvantageous to the semiconductor device.

Mount components to be located around the terminal electrode need to be arranged at a certain distance from an outer periphery of the cylinder portion. When a large top end surface area is provided to secure sufficient connecting region for making connection with the external wiring terminal, that is, when a thick cylinder portion as a whole is provided, the device may be increased in size.

One aspect of the present invention is to provide a semiconductor device including a small-sized connecting terminal allowing peripheral electronic components to be compactly mounted on the circuit board without a need for a large mount region on the circuit board.

An aspect of the present invention is a semiconductor device including a first circuit board including a first principal surface mounted with a plurality of semiconductor elements constituting a main circuit, a second circuit board including a second principal surface mounted with a plurality of electronic components and arranged such that the back surface of the second principal surface opposes the first principal surface, a plurality of connecting terminals securely connected to the first circuit board, and a case covering the first circuit board and the second circuit board. Each of the connecting terminals includes an external terminal connecting portion, having an end surface to connect an external terminal thereto and located at the second principal surface side of the second circuit board faces, and a substrate-fixed portion securely connected to the first circuit board. The external terminal connecting portion and the substrate-fixed portion are eccentrically located when viewed from a direction in which the first circuit board and the second circuit board are opposed. A hole is provided in the case to allow the end surface of the external terminal connecting portion to be exposed therethrough. A seal attachment portion is provided on a portion of the external terminal connecting portion including the end surface to attach thereto a seal member to seal a gap between the portion and the case. At least one of the connecting terminals includes a reduced sectional area portion, having a sectional area smaller than an area of the top end surface, in a region close to the plurality of electronic components arranged on the second circuit board on the external terminal connecting portion. The reduced sectional area portion is provided in a region from the seal attachment portion to an end in the opposite side of the end surface.

In this aspect, each of the connecting terminals includes the external terminal connecting portion, having the end surface to connect the external terminal thereto and located at the second principal surface side of the second circuit board faces, and the substrate-fixed portion which is securely connected to the first circuit board. The external terminal connecting portion and the substrate-fixed portion are eccentrically located when viewed from the direction in which the first circuit board and the second circuit board are opposed. Thus, the connecting terminal can be small-sized and therefore the mount region of the connecting terminal on the circuit board needs not be large. At least one of the connecting terminals is provided with the reduced sectional area portion, having the sectional area smaller than the area of the top end surface of the external terminal connecting portion, in the region of the external terminal connecting portion from the seal attachment portion to the end in the opposite side of the end surface, which region opposes the plurality of electronic components arranged on the second circuit board. Thus, by allowing the top end surface of the external terminal connecting portion to overlap a portion of the electronic component adjoining the reduced sectional area portion when viewed from the direction in which the first circuit board and the second circuit board are opposed, the electronic component can be arranged close enough to the external terminal connecting portion. Electronic components around the connecting terminal can thus be compactly mounted on the circuit board.

In this aspect, the external terminal connecting portion may include a projecting portion that projects from the reduced sectional area portion toward the substrate-fixed portion. In this case, the external terminal connecting portion can carry current easily because a large current-carrying area is sufficiently secured thereby.

In this aspect, a rim of the top end surface of the external terminal connecting portion may have a plurality of straight regions and a shape of the hole may correspond to a shape of the top end surface. When the substrate-fixed portion is secured to a substrate by a single point, the external terminal connecting portion might rotate about the substrate-fixed portion when the external terminal is connected to the top end surface of the external terminal connecting portion by securing with a bolt. If the external terminal connecting portion rotates about the substrate-fixed portion, the portion of the external terminal connecting portion including the end surface might abut the inner wall of the case forming the hole. Since the rim of the top end surface of the external terminal connecting portion has a plurality of straight regions, when the portion of the external terminal connecting portion abuts the inner wall of the case, the end of the straight region abuts the inner wall of the case. As such, the degree of motion (degree of rotation) of the external terminal connecting portion can be kept small. Consequently, even when the substrate-fixed portion is secured to the substrate by a single point, the accuracy of positioning the external terminal connecting portion can be secured.

In this aspect, the top end surface may have a substantially polygonal shape and the hole may have a substantially polygonal shape. In this case, the degree of motion of the external terminal connecting portion can surely be surely kept small.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8 is a side view and a plan view illustrating the output terminal illustrated in FIG. 6.

DESCRIPTION OF THE PREFERRED EMBODIMENTS

The embodiment of the present invention will be described in detail referring to the attached drawings. In the description, the same component or the component having the same function is denoted with the same reference sign and repeated description thereof will be omitted. Dimensional ratios in each drawing may be different from the actual dimensional ratios.

Figure 1:
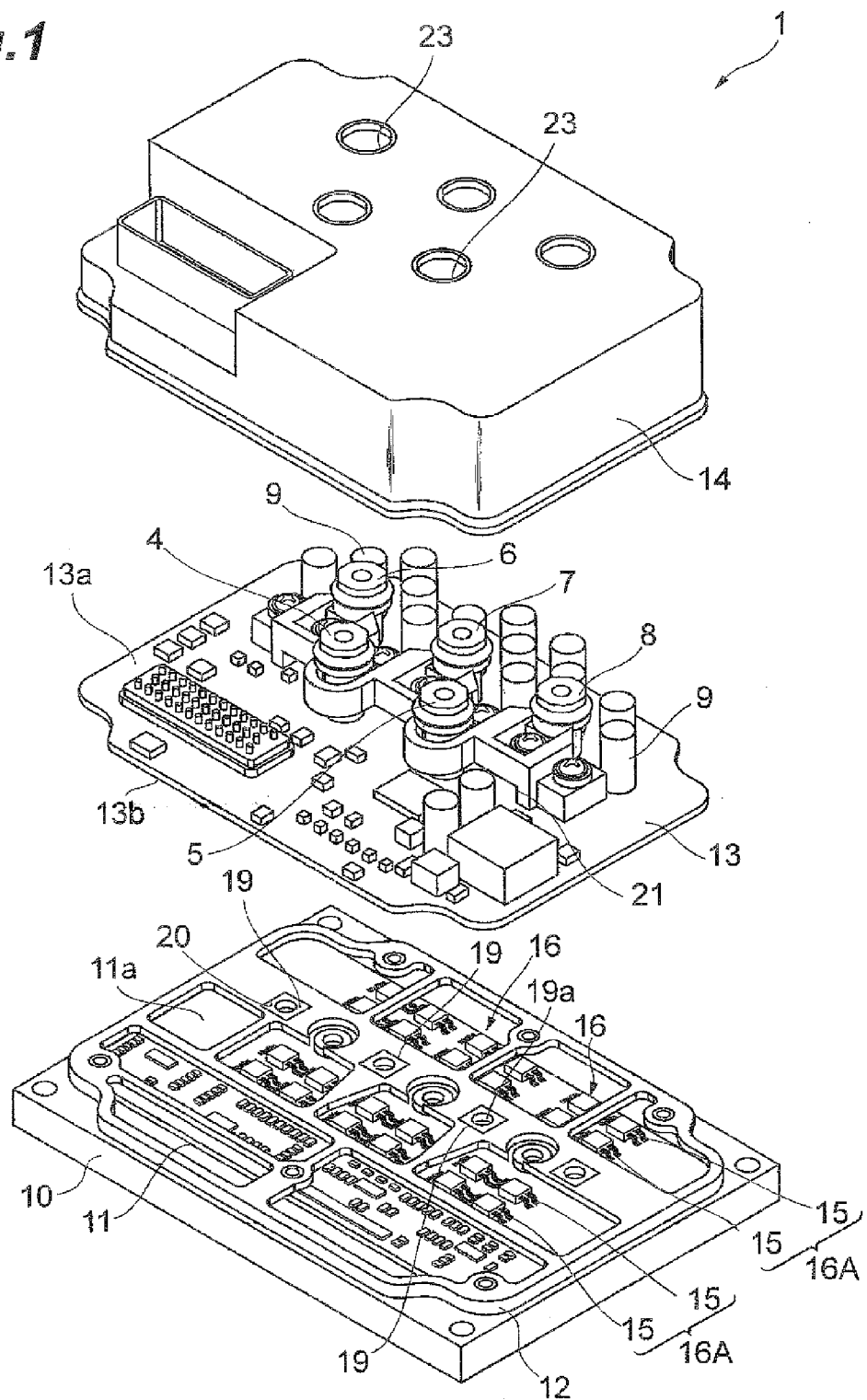
FIG. 1 is an exploded perspective view illustrating an inverter device according to an embodiment of the present invention.
Figure 2:
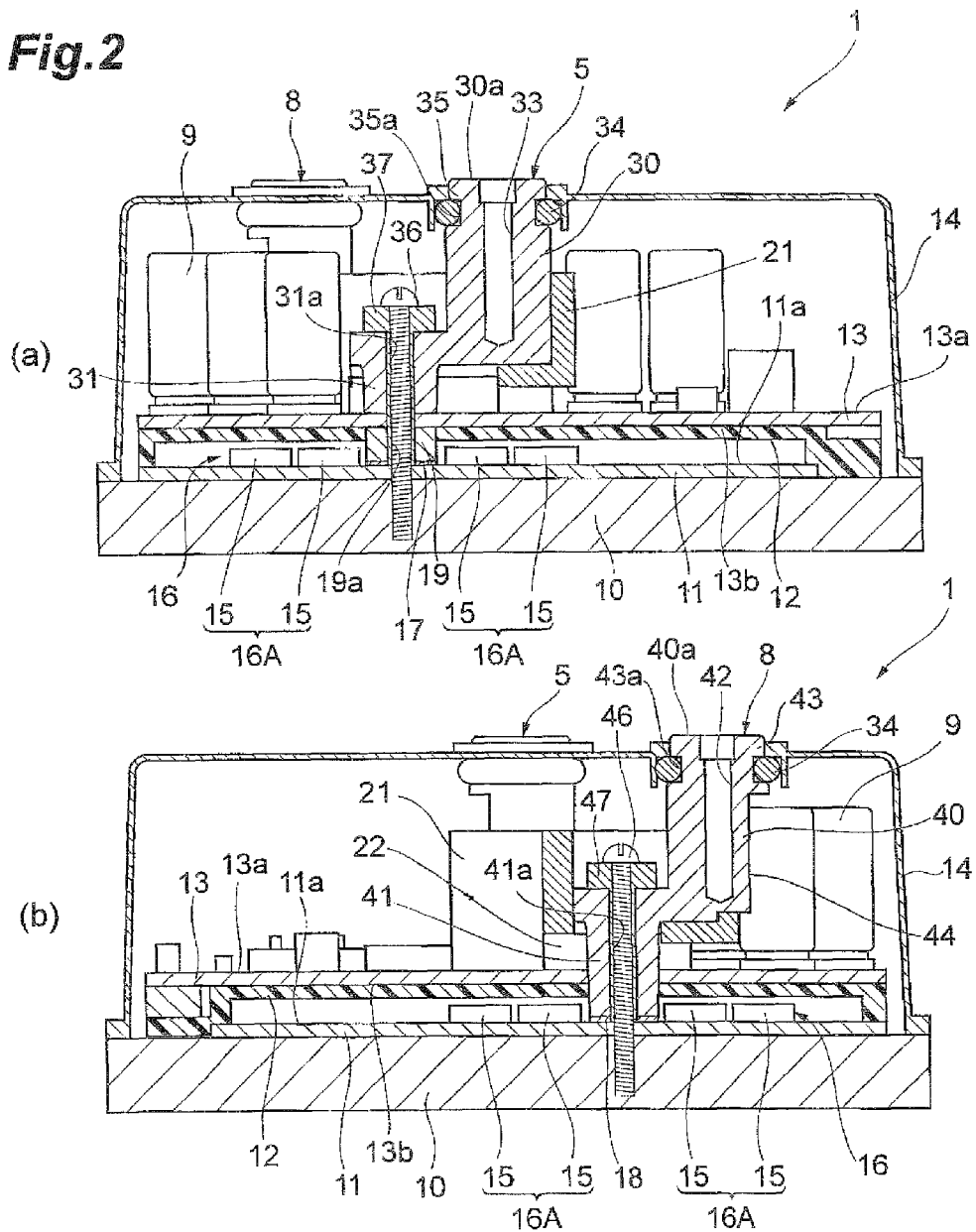
FIG. 2 is sectional views of the inverter device illustrated in FIG. 1.

FIG. 1 is an exploded perspective view illustrating an inverter device according to the embodiment. FIG. 2 is sectional views of the inverter device illustrated in FIG. 1. In FIG. 2, (a) is a sectional view taken along the line IIA-IIA in FIG. 4 and (b) is a sectional view taken along the line IIB-IIB in FIG. 4. The inverter device 1 of the embodiment is, for example, a three-phase inverter device for driving a three-phase AC motor.

Figure 3:
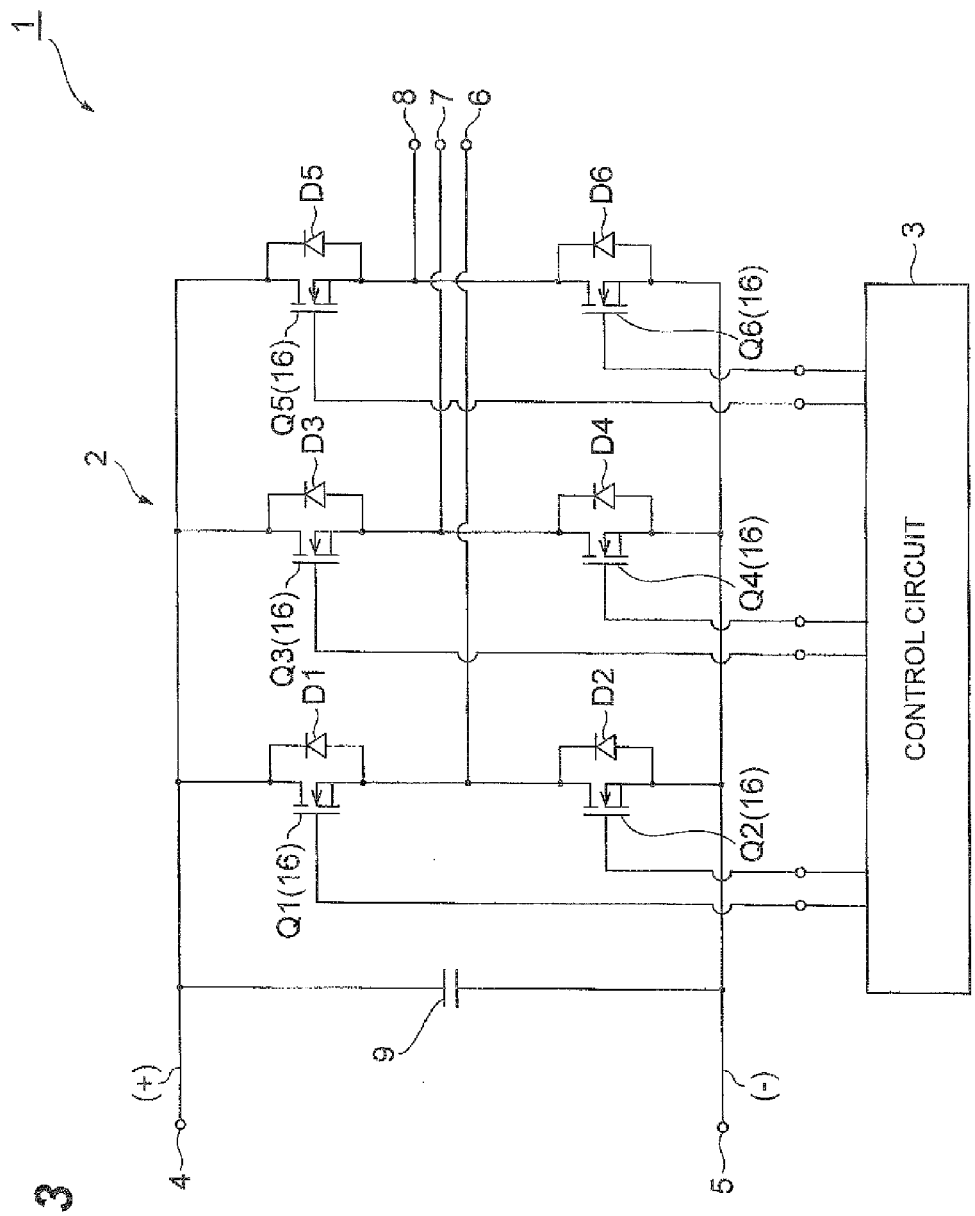
FIG. 3 is a circuit diagram of the inverter device illustrated in FIG. 1.

FIG. 3 is a circuit diagram of the inverter device 1. As illustrated in FIG. 3, the inverter device 1 includes a main circuit 2, a control circuit 3 for controlling the main circuit 2, and a positive electrode terminal 4 and a negative electrode terminal 5. The positive electrode terminal 4 and the negative electrode terminal 5 are connected to the main circuit 2, which is an internal circuit, and an external power source (not shown) such as batteries. The positive electrode terminal 4 and the negative electrode terminal 5 are input terminals to supply power to the main circuit 2 from the external power source.

The main circuit 2 includes six switching elements Q1 to Q6 connected in a three-phase bridge and flywheel diodes D1 to D6 each of which connected in parallel to each of the switching elements Q1 to Q6. For example, metal oxide semiconductor field effect transistor (MOSFET) is used for the switching elements Q1 to Q6. In FIG. 3, a switching element group 16 (see FIG. 1) including a plurality of switching elements (e.g., four switching elements) 15 connected in parallel is illustrated as a component equivalent to each of switching elements Q1 to Q6. A group including the switching elements Q1, Q3, and Q5 and the flywheel diodes D1, D3, and D5 constitutes an upper arm. A group including the switching elements Q2, Q4, and Q6 and the flywheel diodes D2, D4, and D6 constitutes a lower arm.

The switching elements Q1 and Q2 are connected in series between the positive electrode terminal 4 and the negative electrode terminal 5. A U-phase output terminal 6 is connected to the connecting points of the switching elements Q1 and Q2. The switching elements Q3 and Q4 are connected in series between the positive electrode terminal 4 and the negative electrode terminal 5. A V-phase output terminal 7 is connected to the connecting points of the switching elements Q3 and Q4. The switching elements Q5 and Q6 are connected in series between the positive electrode terminal 4 and the negative electrode terminal 5. A W-phase output terminal 8 is connected to the connecting points of the switching elements Q5 and Q6. The U-phase output terminal 6, the V-phase output terminal 7, and the W-phase output terminal 8 are output terminals for supplying three-phase AC power to an external motor.

A capacitor 9 which is an electronic component constituting the main circuit 2 is connected between the positive electrode terminal 4 and the negative electrode terminal 5. In FIG. 3, a plurality of capacitors 9 connected to the main circuit 2 is illustrated as a single capacitor (see FIGS. 1 and 2).

The control circuit 3 controls switching (ON/OFF) of each of the switching elements Q1 to Q6. The control circuit 3 can be configured as a part of an electronic control unit (ECU). For example, the control circuit 3 switches each of the switching elements Q1 to Q6 as required according to a load condition and a value required from an operator.

Now, referring back to FIGS. 1 and 2. The inverter device 1 includes a lower circuit board 11 arranged on a heat sink 10, an upper circuit board 13 arranged above the lower circuit board 11 with a spacer bracket 12 in between, a case 14 covering the lower circuit board 11 and the upper circuit board 13, the positive electrode terminal 4 and the negative electrode terminal 5 (hereinafter, may referred to as input terminals 4 and 5), and the U-phase output terminal 6, the V-phase output terminal 7, and the W-phase output terminal 8 (hereinafter, may referred to as output terminals 6 to 8). The lower circuit board 11 and the upper circuit board 13 function as a first circuit board and a second circuit board, respectively, which are arranged so as to be opposed to each other. In the embodiment, the lower circuit board 11 and the upper circuit board 13 are arranged so as to be opposed to each other with the spacer bracket 12 in between.

The upper circuit board 13 is arranged close to the lower circuit board 11. The lower circuit board 11 is, for example, an insulated metal substrate (IMS). The upper circuit board 13 is, for example, a printed circuit board. The lower circuit board 11 and the upper circuit board 13 are screwed on the heat sink 10. The case 14 is also screwed on the heat sink 10. The input terminals 4 and 5 and the output terminals 6 to 8 function as terminal electrodes (connecting terminals).

Electronic components constituting a part of the main circuit 2 are mounted on the lower circuit board 11. Specifically, the switching element group 16 including a plurality of switching elements (four switching elements in the embodiment) 15 is mounted on the lower circuit board 11. The switching element group 16 is arrayed in six rows along the longitudinal direction of the lower circuit board 11. The switching element group 16 forms the switching elements Q1 to Q6. The switching element group 16 in the upper arm and the switching element group 16 in the lower arm are adjoiningly arranged. The lower circuit board 11 has a first principal surface 11*a* on which a plurality of semiconductor elements (a plurality of switching elements 15) is mounted.

The four switching elements 15 constituting the switching element group 16 are connected in parallel as described above, and arranged along the direction perpendicular to the longitudinal direction of the lower circuit board 11. The four switching elements 15 are separated in two element groups 16A. That is, the switching element group 16 includes the two element groups 16A. In the embodiment, each element group 16A includes two switching elements 15. Each switching element 15 is mounted on the lower circuit board 11. An input electrode pattern 17 and an output electrode pattern 18 are arrayed in the region between the element groups 16A on the lower circuit board 11. Each of the input electrode pattern 17 and the output electrode pattern 18 is electrically connected to each switching element 15 via each wiring pattern (not shown).

Other electronic components constituting the main circuit 2 and electronic components constituting the control circuit 3 are also mounted on the lower circuit board 11.

The spacer bracket 12 includes a plurality of electrode accommodating portions (four electrode accommodating portions in the embodiment) 20 which accommodates a rectangular relay electrode 19. The relay electrode 19 has a penetration hole 19*a* which a terminal securing screw 36 penetrates therethrough. When the spacer bracket 12 is mounted on the lower circuit board 11, the relay electrode 19 accommodated in each electrode accommodating portion 20 is arranged in the region between element groups 16A. The relay electrode 19 is electrically connected to the input electrode pattern 17 formed on the lower circuit board 11.

Figure 4:
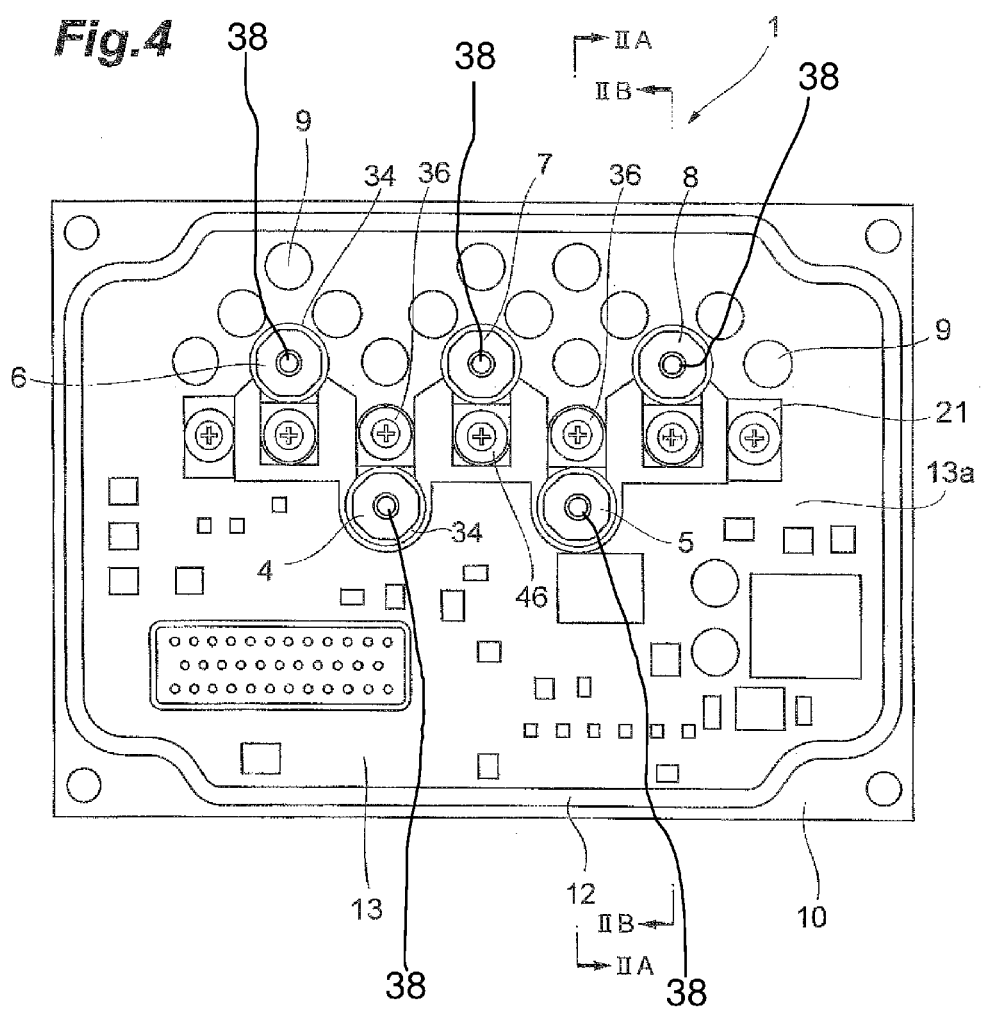
FIG. 4 is a plan view illustrating a structure of an upper circuit board mounted with components.

As illustrated also in FIG. 4, the plurality of capacitors 9 and components constituting the control circuit 3 are mounted on the upper circuit board 13. On the upper circuit board 13, the input terminals 4 and 5 and the output terminals 6 to 8 are secured via a secure bracket 21 in the region between the region mounted with the capacitors 9 and the region mounted with the components constituting the control circuits 3. On the upper circuit board 13, the input terminals 4 and 5 are secured in a side near to the region mounted with the components constituting the control circuit 3. On the upper circuit board 13, the output terminals 6 to 8 are secured in a side near to the region mounted with the capacitors 9. The upper circuit board 13 has a top surface (second principal surface) 13*a* mounted with a plurality of electronic components (e.g., a plurality of capacitors 9). A back surface 13*b* in the back of the top surface 13*a* and the first principal surface 11*a* oppose each other with the spacer bracket 12 in between.

A current sensor 22 is provided in a region on the upper circuit board 13 corresponding to securing portions of the output terminals 7 and 8. The current sensor 22 detects currents flowing in the output terminals 7 and 8. The current sensor 22 is arranged between the upper circuit board 13 and the secure bracket 21.

Five holes 23 through which top end surfaces 30*a* and 40*a* of the input terminals 4 and 5 and the output terminals 6 to 8 are exposed out of the case 14 are formed in the upper portion of the case 14. The inner walls of the case 14 defining each of the holes 23 determine the position of each top end portion of the input terminals 4 and 5 and the output terminals 6 to 8.

Each of the input terminals 4 and 5 is formed in a shape with a crank (in (a) of FIG. 2, only the input terminal 5 is illustrated). Each of the input terminals 4 and 5 includes an external terminal connecting portion 30 connected to the external wiring terminal 38 and a substrate-fixed portion 31 securely connected to the lower circuit board 11. The substrate-fixed portion 31 is integrally and eccentrically provided to the external terminal connecting portion 30. In the embodiment, the external terminal connecting portion 30 and the substrate-fixed portion 31 are eccentrically located when viewed from a direction in which the upper circuit board 13 and the lower circuit board 11 are opposed. Further, the external terminal connecting portion 30 and the substrate-fixed portion 31 are in different locations along the direction in which the upper circuit board 13 and the lower circuit board 11 are opposed. The substrate-fixed portion 31 is located closer to the lower circuit board 11 (upper circuit board 13) than the external terminal connection portion 30 when viewed from a direction perpendicular to the direction in which the upper circuit board 13 and the lower circuit board 11 are opposed. In the embodiment, the direction in which the upper circuit board 13 and the lower circuit board 11 are opposed is a direction perpendicular to the upper circuit board 13 and the lower circuit board 11.

The external terminal connecting portion 30 has the top end surface 30a. The top end surface 30a is an external terminal securing surface to which the external wiring terminal (not shown) is secured with a bolt 32 (see FIG. 7). The top end surface 30a is formed in a substantially polygonal shape (substantially octagonal shape in the embodiment). The hole 23 in the case 14 is formed in a substantially polygonal shape (substantially octagonal shape in the embodiment) corresponding to the shape of the top end surface 30a. That is, the hole 23 has a substantially polygonal shape with the same number of corners as the top end surface 30a. The rim of the top end surface 30a of the external terminal connecting portion 30 has a plurality of straight regions and the shape of the hole 23 corresponds to the shape of the top end surface 30a. The external terminal connecting portion 30 extends from the top end surface 30a to the upper circuit board 13. A threaded portion 33 configured to engage with the bolt 32 is formed in the external terminal connecting portion 30. In the embodiment, the external terminal connecting portion 30 is located at the top surface 13a side of the upper circuit board 13.

A seal attachment portion 35 is provided in the upper portion of the external terminal connecting portion 30. A seal member 34 is attached to the seal attachment portion 35 to seal the gap between the upper portion of the external terminal connecting portion 30 and the case 14. For example, a rubber O-ring is used as the seal member 34. The seal attachment portion 35 is configured to have an annular groove 35a in which the seal member 34 is fitted. The seal member 34 is fitted against the inner walls forming the hole 23 of the case 14 to seal the gap between the case 14 and the external terminal connecting portion 30. In the embodiment, the upper portion of the external terminal connecting portion 30 includes the top end surface 30a.

Since the annular groove 35a is provided in the upper portion of the external terminal connecting portion 30 to fit the seal member 34 therein, a sufficient area of the top end surface (external terminal securing surface) 30a of the external terminal connecting portion 30 can be secured. That is, the input terminals 4 and 5 have smaller contact resistance between the external terminals than a conventional terminal configured with an upper portion of the terminal electrode formed in a tapered shape in which the diameter gradually decreases toward the top end surface to provide easy attachment of an O-ring. Heat generated in the input terminals 4 and 5 (external terminal connecting portion 30) by a supplied current can therefore be suppressed. Since a stress applied to the external terminal securing surface 30a when screwing the bolt 32 is reduced, the restriction to the condition of securing the external terminal can be relieved. Since the seal attachment portion 35 needs not be provided as a separate part, the rise in cost can be suppressed.

The substrate-fixed portion 31 has a penetration hole 31a which the terminal securing screw 36 penetrates therethrough. The input terminals 4 and 5 are securely connected to the lower circuit board 11 with terminal securing screws 36. In the embodiment, the input terminals 4 and 5 are securely connected to the lower circuit board 11 via the upper circuit board 13 and the relay electrode 19. The input terminals 4 and 5 are secured to the lower circuit board 11 through the following processes. A lower portion of the external terminal connecting portion 30 is placed on the secure bracket 21 and the substrate-fixed portion 31 is placed on the input wiring pattern on the top surface 13a of the upper circuit board 13. At this time, the relay electrode 19 is arranged between the lower circuit board 11 and the upper circuit board 13 so as to electrically connect the input wiring pattern on the back surface 13b of the upper circuit board 13 and the input electrode pattern 17 on the lower circuit board 11. In this state, the terminal securing screw 36 is inserted in the penetration hole 31a in the substrate-fixed portion 31 via an insulator 37. The terminal securing screw 36 penetrates through the upper circuit board 13, the relay electrode 19, and the lower circuit board 11 to be secured in the threaded hole formed in the heat sink 10, thereby integrally securing these plurality of members. Through these processes, the input terminals 4 and 5 are securely connected to the lower circuit board 11. The input wiring pattern on the top surface 13a of the upper circuit board 13 is electrically connected to the input wiring pattern on the back surface 13b of the upper circuit board 13.

Each of the output terminals 6 to 8 is formed in a shape with a crank, similarly to the input terminals 4 and 5 (in (b) of FIG. 2, only the output terminal 8 is illustrated). Each of the output terminals 6 to 8 includes an external terminal connecting portion 40 connected to the external wiring terminal (not shown) and a substrate-fixed portion 41 secured to the lower circuit board 11. The substrate-fixed portion 41 is integrally and eccentrically provided to the external terminal connecting portion 40. In the embodiment, the external terminal connecting portion 40 and the substrate-fixed portion 41 are eccentrically located when viewed from the direction in which the upper circuit board 13 and the lower circuit board 11 are opposed. Further, the external terminal connecting portion 40 and the substrate-fixed portion 41 are in different locations along the direction in which the upper circuit board 13 and the lower circuit board 11 are opposed. The substrate-fixed portion 41 is located closer to the lower circuit board 11 than the external terminal connecting portion 40 when viewed from the direction perpendicular to the direction in which the upper circuit board 13 and the lower circuit board 11 are opposed.

The external terminal connecting portion 40 has the top end surface (an end surface) 40a. The top end surface 40a is an external terminal securing surface to which the external wiring terminal (not shown) is secured with a bolt. Similarly to the top end surface 30a of the external terminal connecting portion 30, the top end surface 40a is formed in a substantially polygonal shape (substantially octagonal shape in the embodiment). The external terminal connecting portion 40 extends from the top end surface 40a to the upper circuit board 13. A threaded portion 42 configured to engage with the bolt is formed in the external terminal connecting portion 40. In the embodiment, the external terminal connecting portion 40 is located at the top surface 13a side of the upper circuit board 13.

A seal attachment portion 43 is provided in the upper portion (first portion) of the external terminal connecting portion 40. A seal member 34 is attached to the seal attachment portion 43 to seal the gap between the upper portion of the external terminal connecting portion 40 and the case 14. Similarly to the seal attachment portion 35, the seal attachment portion 43 is configured to have an annular groove 43a in which the seal member 34 is fitted. In the embodiment, the upper portion of the external terminal connecting portion 40 includes the top end surface 40a.

Figure 5:
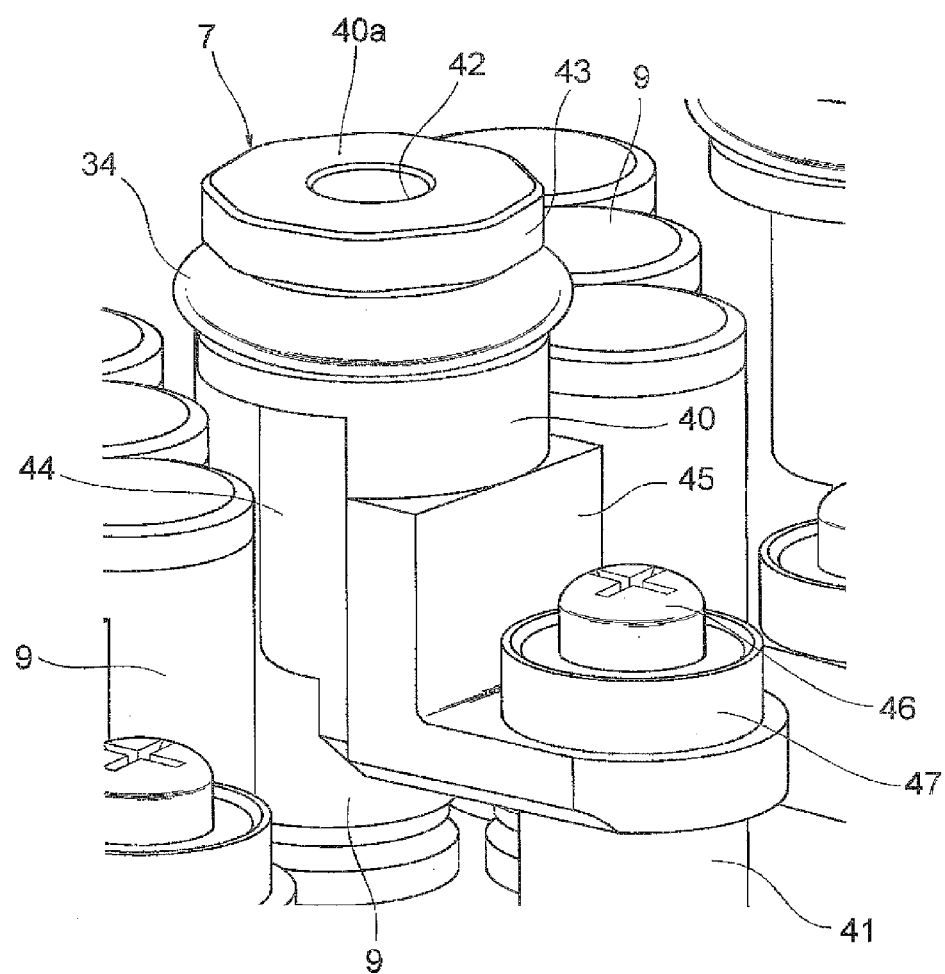
FIG. 5 is a perspective view illustrating the arrangement of an output terminal and a capacitor illustrated in FIG. 1.
Figure 6:
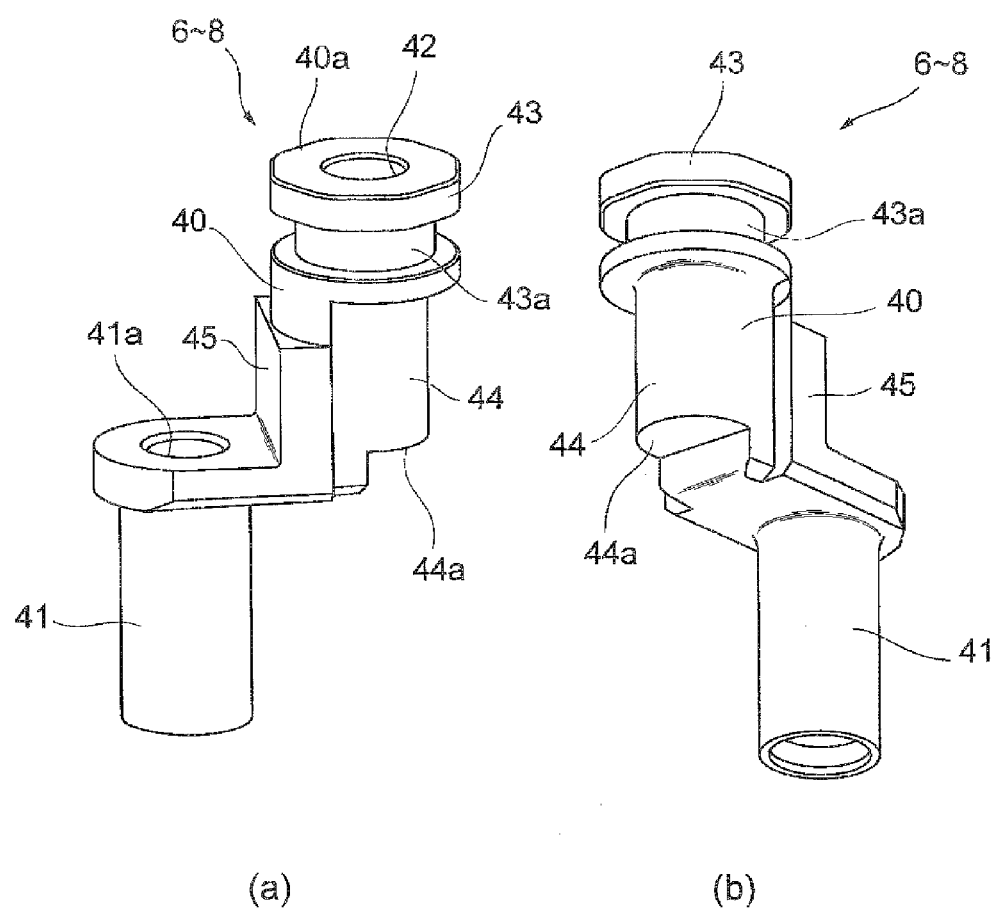
FIG. 6 is perspective views illustrating the output terminal illustrated in FIG. 5.

As illustrated in FIGS. 5 and 6, a reduced sectional area portion (a portion with a reduced sectional area) 44 having a sectional area smaller than an area of the top end surface 40a of the external terminal connecting portion 40 is provided in the opposite side to the substrate-fixed portion 41 of the external terminal connecting portion 40, that is, in a region opposing a plurality of other electronic components arranged on the upper circuit board 13. The reduced sectional area portion 44 has a substantially half-circle-shaped cross section. The reduced sectional area portion 44 is formed in the region from the bottom end of the seal attachment portion 43 of the external terminal connecting portion 40 to the bottom end of the external terminal connecting portion 40. That is, the external terminal connecting portion 40 has the upper portion and a lower portion (second portion) including an end surface in the opposite side of the top end surface 40*a*, where the sectional area of the lower part taken along a plane parallel to the top surface 13*a* (upper circuit board 13) is smaller than the area of the top end surface 40*a*. Further, in the direction from which the external terminal connecting portion 40 and the substrate-fixed portion 41 are eccentrically located, an edge, in the region in the opposite side to the substrate-fixed portion 41, in the lower portion of the external terminal connecting portion 40 is located closer to the substrate-fixed portion 41 than an edge, in the region in the opposite side to the substrate-fixed portion 41, in the upper portion of the external terminal connecting portion 40. A step is formed between the upper portion and the lower portion of the external terminal connecting portion 40. A notch portion 44*a* is formed in a stepped shape to be provided as a mount surface, which contacts the secure bracket 21 in the lower portion of the external terminal connecting portion 40.

Figure 7:
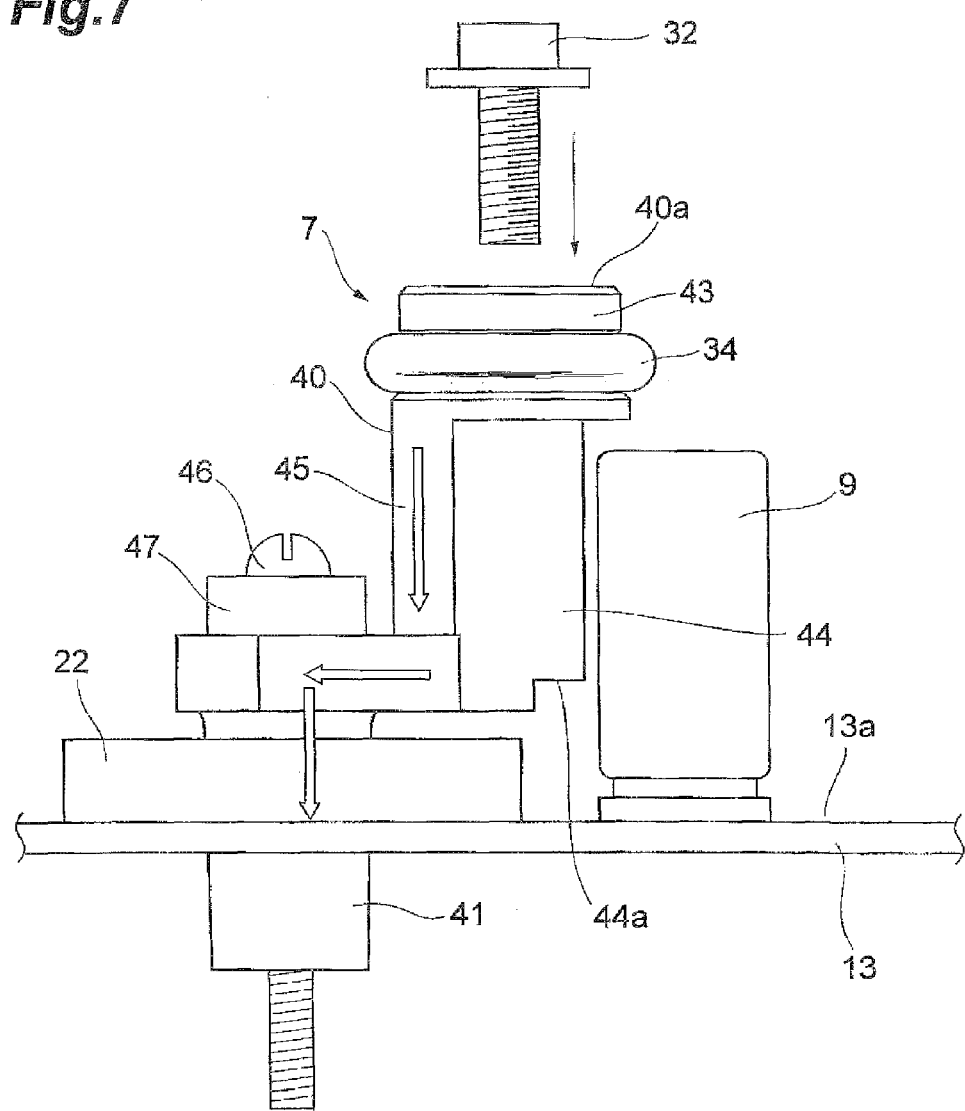
FIG. 7 is a side view illustrating the arrangement of the output terminal and the capacitor illustrated in FIG. 5.

Since the current flows the shortest route in the output terminals 6 to 8, the current mainly flows from the top end surface 40*a* of the external terminal connecting portion 40 to the substrate-fixed portion 41 via the region, close to the substrate-fixed portion 41, in the external terminal connecting portion 40 as illustrated in FIG. 7. That is, the current will not concentrate in the region, in the opposite side to the substrate-fixed portion 41, in the external terminal connecting portion 40, and therefore even if the region is reduced, the current-carrying performance of the output terminals 6 to 8 will not be deteriorated easily.

A projection (projecting portion) 45 projecting toward the substrate-fixed portion 41 is provided in a region lower than the seal attachment portion 43 of the external terminal connecting portion 40. That is, the projection 45 is provided in the region (opposite to the region where the capacitor 9 is provided) of the lower portion close to the substrate-fixed portion 41. Further, the projection 45 projects toward the substrate-fixed portion 41 when viewed from the direction in which the upper circuit board 13 and the lower circuit board 11 are opposed. The projection 45 is formed in a manner that the sectional area of the substantially cylindrical external terminal connecting portion locally increases and the section swells out toward the substrate-fixed portion 41. In this configuration, the projection 45 having three plane side surfaces is integrally formed on the portion of the side surface of the cylindrical shape of the external terminal connecting portion 40. By providing the projection 45 on the external terminal connecting portion 40, the current-carrying area of the external terminal connecting portion 40 can be secured even when the region, in the opposite side to the substrate-fixed portion 41, in the external terminal connecting portion 40 is reduced.

The substrate-fixed portion 41 has a penetration hole 41*a* which a terminal securing screw 46 penetrates therethrough. The output terminals 6 and 8 are securely connected to the lower circuit board 11 with terminal securing screws 46. The output terminals 6 to 8 are secured to the lower circuit board 11 through the following processes. A lower end of the external terminal connecting portion 40 is placed on the secure bracket 21 and the substrate-fixed portion 41 is placed on the output electrode pattern 18 on the lower circuit board 11 via the penetration hole formed in the upper circuit board 13. In this state, the terminal securing screw 46 is inserted in the penetration hole 41*a* in the substrate-fixed portion 41 via an insulator 47. The terminal securing screw 46 is screwed into the threaded hole formed in the heat sink 10 via the lower circuit board 11. Through these processes, the output terminals 6 to 8 are secured to the lower circuit board 11.

As described above in the embodiment, since the terminal securing screw 36 secures each of the input terminals 4 and 5 to the lower circuit board 11 at a single point and the terminal securing screw 46 secures each of the output terminals 6 to 8 to the lower circuit board 11 at a single point, the securing area (mount region) for the input terminals 4 and 5 and the output terminals 6 to 8 on the lower circuit board 11 is kept relatively small. Consequently, the size of the lower circuit board 11 can be reduced and the inverter device 1 can be down sized.

The reduced sectional area portion 44 is provided in the region from the seal attachment portion 43 of the external terminal connecting portion 40 of the output terminals 6 to 8 to the bottom end of the external terminal connecting portion 40. That is, the sectional area of the lower portion of the external terminal connecting portion 40 is smaller than the area of the top end surface 40*a*. Further, in the direction from which the external terminal connecting portion 40 and the substrate-fixed portion 41 are eccentrically located, the edge, in the region in the opposite side to the substrate-fixed portion 41, in the lower portion of the external terminal connecting portion 40 is located closer to the substrate-fixed portion 41 than the edge, in the region in the opposite side to the substrate-fixed portion 41, in the upper portion of the external terminal connecting portion 40. For example, the tall capacitor 9 can therefore be mounted on the upper circuit board 13 such that a portion of the capacitor 9 is located inside the outer rim of the top end surface 40*a*, that is, to the inner side (central side) of the external terminal connecting portion 40 as illustrated in FIGS. 5 and 7. When viewed from the direction in which the upper circuit board 13 and the lower circuit board 11 are opposed, the top end surface 40*a* overlaps a portion of the capacitor 9 located adjacent to the reduced sectional area portion 44. That is, the upper portion of the external terminal connecting portion 40 is partially positioned above the capacitor 9. So that the capacitor 9 can be mounted on the upper circuit board 13 to be close to the external terminal connecting portion 40. In this manner, for example, the plurality of capacitors 9 can densely be mounted on the upper circuit board 13 with high space efficiency. Consequently, the size of the upper circuit board 13 can further be reduced and the inverter device 1 can further be down sized.

Since each of the output terminals 6 to 8 is secured to the lower circuit board 11 by the single point, the external terminal connecting portion 40 might rotate about the center of the substrate-fixed portion 41 when an external terminal (not shown) is connected to the external terminal securing surface 40*a* with the bolt 32. As illustrated in FIG. 8, the rim of the top end surface 40*a* of the external terminal connecting portion 40 has a plurality of straight regions and the shape of the hole 23 corresponds to the shape of the top end surface 40*a*. Specifically, the top end surface 40*a* of the external terminal connecting portion 40 of each of the output terminals 6 to 8 has a substantially polygonal shape and the hole 23 of the case 14 also has a substantially polygonal shape corresponding to the shape of the top end surface 40*a*.

That is, the hole 23 has a substantially polygonal shape with the same number of corners as the top end surface 40a. In this manner, the degree of motion of the external terminal connecting portion 40 about the center of the substrate-fixed portion 41 occurring when securing the external terminal (not shown) to the external terminal securing surface 40a with the bolt 32 can be reduced compared to the case where the hole 23 and the top end surface 40a has circular shapes.

Figure 9:
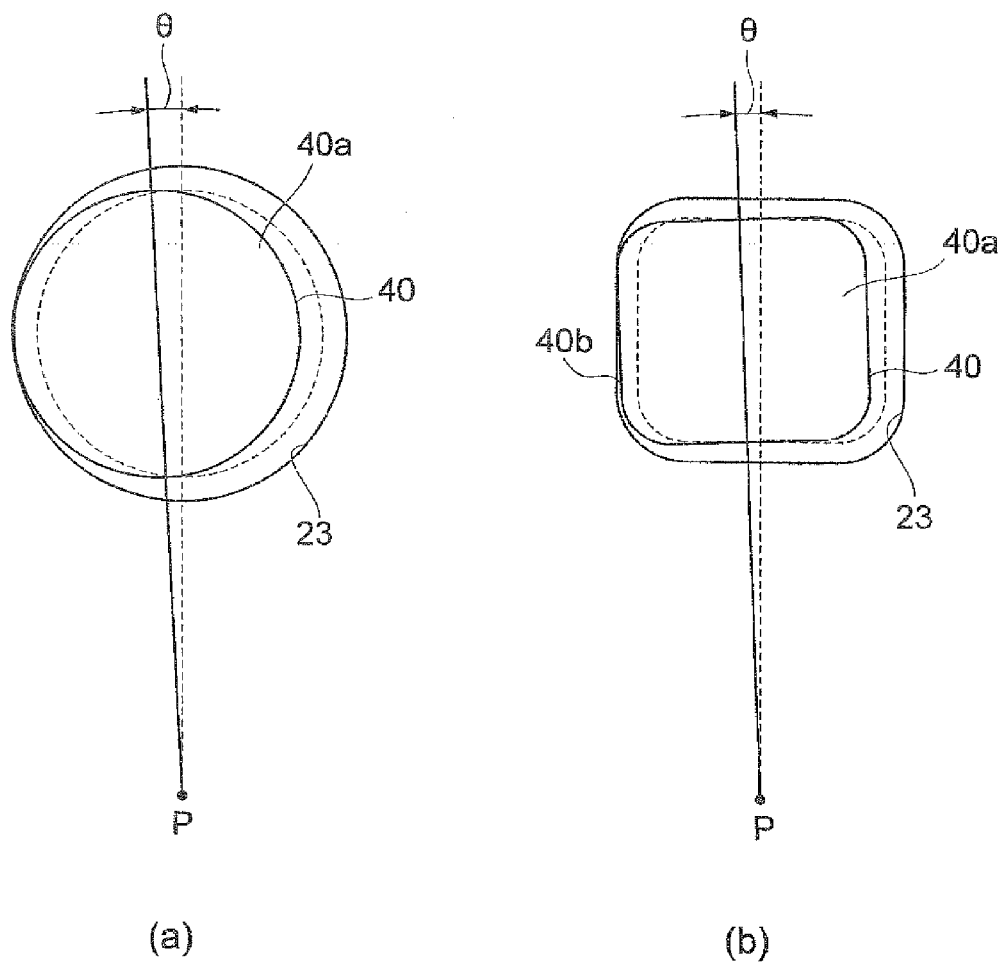
FIG. 9 illustrates a degree of motion of the external terminal connecting portion from the center of the substrate-fixed portion.

Specifically, the clearance between the upper portion of the external terminal connecting portion 40 of each of the output terminals 6 to 8 and the inner wall of the case 14 forming the hole 23 is set to a value determined by taking variations during assembly into consideration. As illustrated in (b) of FIG. 9, for example, when the top end surface 40a has a substantially rectangular shape and the hole 23 has a substantially rectangular shape, the motion of the output terminals 6 to 8 created by screwing the bolt 32 makes the upper portion of the external terminal connecting portion 40 abut the inner wall of the case 14, particularly, the end of the straight region 40b of the top end surface 40a abuts the inner wall of the case 14. In this case, the distance which the upper portion of the external terminal connecting portion 40 moves until abutting the inner wall of the case 14 is smaller than the case where the top end surface 40a has a circular shape and the hole 23 has a circular shape as illustrated in (a) of FIG. 9. Accordingly, when the top end surface 40a has a substantially polygonal shape and the hole 23 has a substantially polygonal shape, a motion angle θ by which the external terminal connecting portion 40 rotates about a center P of the substrate-fixed portion 41 is small.

As described above, the degree of motion of the external terminal connecting portion 40 about the center P of the substrate-fixed portion 41 can be securely kept small. Consequently, positioning of the output terminals 6 to 8 with high accuracy and suppression of rotation of the output terminals 6 to 8 when securing with the bolt 32 can both be realized even when the substrate-fixed portion 41 is secured to the lower circuit board 11 at a single point with the terminal securing screw 46.

For the input terminals 4 and 5, the degree of motion of the external terminal connecting portion 30 about the center of the substrate-fixed portion 31 can be securely kept small. Consequently, positioning of the input terminals 4 and 5 with high accuracy and suppression of rotation of the input terminals 4 and 5 when securing with the bolt 32 can both be realized even when the substrate-fixed portion 31 is secured to the upper circuit board 13 (lower circuit board 11) at the single point with the terminal securing screw 36.

The embodiment of the present invention is not limited to the embodiment described above. For example, in the embodiment, the reduced sectional area portion 44 having the sectional area smaller than the area of the top end surface 40a is provided in the region opposite to the substrate-fixed portion 41, of the external terminal connecting portion 40 of each of the output terminals 6 to 8 since the capacitors 9 is arranged close to the output terminals 6 to 8. If the capacitors 9 is arranged close to the input terminals 4 and 5, a reduced sectional area portion having a sectional area smaller than an area of the top end surface 30a may be provided in the region opposite to the substrate-fixed portion 31, of the external terminal connecting portion 30 of each of the input terminals 4 and 5.

In the embodiment, the reduced sectional area portion 44 is provided in the external terminal connecting portion 40 of each of the output terminals 6 to 8 to secure a space near each of the output terminals 6 to 8 to arrange the capacitors 9. To secure a space to arrange electronic components constituting the main circuit 2 other than the capacitors 9, a reduced sectional area portion may be provided in each of external terminal connecting portions of at least either of the input terminals 4 and 5 or the output terminals 6 to 8.

In the embodiment, the top end surface 30a of the external terminal connecting portion 30 of each of the input terminals 4 and 5 and the top end surface 40a of the external terminal connecting portion 40 of each of the output terminals 6 to 8 have substantially polygonal shapes and corresponding to these shapes, the holes 23 of the case 14 have substantially polygonal shapes. The shapes of the top end surfaces 30a and 40a are not particularly limited to substantially polygonal shapes. The rim of each of the top end surfaces 30a and 40a may have the plurality of straight regions. In this case, the holes 23 preferably have shapes corresponding to the shapes of the top end surfaces 30a and 40a. Even when the input terminals 4 and 5 and the output terminals 6 to 8 are each secured to the upper circuit board 13 by a single point, if each motion angle of the external terminal connecting portions 30 and 40 about each center of substrate-fixed portions 31 and 41 is small, the top end surfaces 30a and 40a may have circular shapes and the hole 23 of the case 14 may also have a circular shape.

The present invention is not limited to the three-phase inverter device 1 as in the embodiment, and can be applied to, for example, a DC-DC converter.

What is claimed is:

1. A semiconductor device comprising:
   a first circuit board including a first principal surface mounted with a plurality of semiconductor elements constituting a main circuit;
   a second circuit board including a second principal surface mounted with a plurality of electronic components and being arranged such that a back surface of the second principal surface opposes the first principal surface;
   a plurality of connecting terminals securely connected to the first circuit board; and
   a case covering the first circuit board and the second circuit board, wherein:
   each of the connecting terminals includes an external terminal connecting portion, having an end surface to connect an external terminal thereto and located at the second principal surface side of the second circuit board faces, and a substrate-fixed portion securely connected to the first circuit board at a single point with a screw, the external terminal connecting portion and the substrate-fixed portion being eccentrically located when viewed from a direction in which the first circuit board and the second circuit board are opposed,
   a hole is provided in the case to allow the end surface of the external terminal connecting portion to be exposed therethrough, the end surface being secured to a corresponding external terminal with a bolt whereby the external terminal connecting portion may abut an inner wall of the case defining the hole when the external terminal is secured to the end surface with the bolt,
   a seal attachment portion is provided on a portion of the external terminal connecting portion including the end surface to attach thereto a seal member to seal a gap between the external terminal connecting portion and the case, the seal attachment portion of a top end surface of the external terminal connecting portion having a plurality of straight regions and a shape of the hole corresponding to a shape of the top end surface,
   at least one of the connecting terminals includes a reduced sectional area portion having a sectional area smaller than an area of the top end surface in a region facing the plurality of electronic components arranged on the second circuit board on the external terminal connecting portion, the reduced sectional area portion is provided in a region from the seal attachment portion to an end in an opposite side of the end surface and has a substantially half-circle-shaped cross-section, the external terminal connecting portion includes a projecting portion that projects from the reduced sectional area portion toward the substrate-fixed portion, and the top end surface has a substantially polygonal shape and the hole has a substantially polygonal shape, and wherein the electronic component includes a capacitor located adjacent to the reduced sectional area portion and the end surface of the external terminal connecting portion is positioned to overlap the capacitor when viewed from the direction in which the first circuit board and the second circuit board are opposed.

2. The semiconductor device according to claim 1, wherein the external terminal connecting portion includes a first portion having the end surface and provided with the seal attachment portion and a second portion having an end surface in the opposite side of the end surface, a sectional area of the second portion taken in a plane parallel to the second principal surface is smaller than an area of the end surface, and an edge, in an opposite side of the substrate-fixed portion, of the second portion is closer to the substrate-fixed portion than an edge, in an opposite side of the substrate-fixed portion, of the first portion when compared along a direction in which the external terminal connecting portion and the substrate-fixed portion are eccentrically located.

3. The semiconductor device according to claim 2, wherein the projecting portion is provided in a region, close to the substrate-fixed portion, of the second portion so as to project toward the substrate-fixed portion when viewed from the direction in which the first circuit board and the second circuit board are opposed.

4. The semiconductor device according to claim 1, wherein the projecting portion is formed in a manner that the sectional area of the external terminal connecting portion locally increases and the sectional area swells out toward the substrate-fixed portion.

5. The semiconductor device according to claim 1, wherein a portion of the external terminal connecting portion including the end surface suppresses a rotation of the external terminal connecting portion around the substrate-fixed portion by contact with the inner wall of the case defining the hole.

* * * * *